US012742454B2

(12) United States Patent
Yuan et al.

(10) Patent No.: US 12,742,454 B2
(45) Date of Patent: Sep. 22, 2026

(54) ADAPTER PLATE TO ATTACH TURBO PUMPS TO PROCESS MODULES

(71) Applicant: LAM RESEARCH CORPORATION, Fremont, CA (US)

(72) Inventors: Bin Yuan, Monte Sereno, CA (US); Heather Pedersen, San Jose, CA (US); Allan Ronne, Santa Clara, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 960 days.

(21) Appl. No.: 17/907,881

(22) PCT Filed: Mar. 1, 2021

(86) PCT No.: PCT/US2021/020193
§ 371 (c)(1),
(2) Date: Aug. 29, 2022

(87) PCT Pub. No.: WO2021/178270
PCT Pub. Date: Sep. 10, 2021

(65) Prior Publication Data

US 2023/0114538 A1 Apr. 13, 2023

Related U.S. Application Data

(60) Provisional application No. 62/983,839, filed on Mar. 2, 2020.

(51) Int. Cl.
*F04B 53/22* (2006.01)
*H10P 72/00* (2026.01)

(52) U.S. Cl.
CPC .......... *F04B 53/22* (2013.01); *H10P 72/0421* (2026.01)

(58) Field of Classification Search
USPC .................................................... 118/715, 50
See application file for complete search history.

(56) References Cited

U.S. PATENT DOCUMENTS 5,746,434 A 5/1998 Boyd et al.
10,170,342 B2 1/2019 Samir et al.
(Continued)

FOREIGN PATENT DOCUMENTS

CN 109706435 A * 5/2019
EP 1258634 A1 * 11/2002 .......... F04D 29/601
(Continued)

OTHER PUBLICATIONS

English Translation CN-109706435 (Year: 2019).*
(Continued)

*Primary Examiner* — Yewebdar T Tadesse

(57) ABSTRACT

A system comprises a process module, a pump, and an adapter plate. The process module processes a semiconductor substrate, has an opening at a lower end, and includes a poppet valve above the opening. The pump operates in conjunction with the poppet valve to evacuate gases from the process module. The adapter plate is arranged above the pump and below the opening at the lower end of the process module. The adapter plate includes an inner cavity coincident with the opening and an outer perimeter smaller than the lower end of the process module. The adapter plate includes a first set of bores arranged around the inner cavity and a second set of bores arranged along the outer perimeter. First fasteners fasten the pump to the adapter plate through the first set of bores. Second fasteners fasten the adapter plate to the process module through the second set of bores.

15 Claims, 6 Drawing Sheets

(56) References Cited

U.S. PATENT DOCUMENTS

| | | | |
|---|---|---|---|
| 2002/0172589 | A1 | 11/2002 | Yamashita et al. |
| 2018/0211893 | A1 | 7/2018 | Ichino et al. |
| 2018/0233327 | A1 | 8/2018 | Kalnin et al. |
| 2018/0340521 | A1 | 11/2018 | Takeda |

FOREIGN PATENT DOCUMENTS

| | | | |
|---|---|---|---|
| JP | 2002327698 | A | 11/2002 |
| JP | 2008129358 | A | 6/2008 |
| JP | 2016526279 | A | 9/2016 |
| JP | 2017014945 | A | 1/2017 |
| JP | 2018120881 | A | 8/2018 |
| JP | 2018155223 | A | 10/2018 |
| JP | 2018200042 | A | 12/2018 |
| WO | WO-2014179093 | A1 | 11/2014 |

OTHER PUBLICATIONS

International Search Report and Written Opinion of the ISA issued in PCT/US2021/020193, mailed Jun. 30, 2021; ISA/KR.
Japanese Office Action for Japanese Application No. 2022-552517 amiled Nov. 5, 2024.

* cited by examiner 100
112
102
121
115
110

111
120
122
124

100
112
170
102
184
186
121
115
PM Opening
Inner Diameter 150 of Adapter Plate
110
182
180
111
120
122
124

190
123
170
186
111
121
102
115
184
182
181
192
166
101
H_diff

ADAPTER PLATE TO ATTACH TURBO PUMPS TO PROCESS MODULES

CROSS-REFERENCE TO RELATED APPLICATIONS

This application is a U.S. National Phase Application under 35 U.S.C. 371 of International Application No. PCT/US2021/020193, filed on Mar. 1, 2021, which claims the benefit of U.S. Provisional Application No. 62/983,839, filed on Mar. 2, 2020. The entire disclosures of the applications referenced above are incorporated herein by reference.

FIELD

The present disclosure relates generally to semiconductor processing systems and more particularly to an adapter plate for attaching a turbo pump to a process module of a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes one or more processing chambers (also called process modules) to perform deposition, etching, and other treatments on substrates such as semiconductor wafers. During processing, a substrate is arranged on a substrate support such as a pedestal in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

Many semiconductor processes are performed at vacuum. A turbo pump may be used to maintain a chamber at vacuum. In some processes, a pendulum valve is arranged between the turbo pump and a bottom opening to the chamber. The turbo pump is mounted to the pendulum valve, and the pendulum valve is mounted to the chamber.

SUMMARY

A system comprises a process module, a pump, and an adapter plate. The process module is configured to process a semiconductor substrate. The process module has an opening at a lower end of the process module and includes a poppet valve arranged in the process module above the opening. The pump is configured to operate in conjunction with the poppet valve to evacuate gases from the process module. The adapter plate is arranged above the pump and below the opening at the lower end of the process module. The adapter plate includes an inner cavity coincident with the opening and an outer perimeter smaller than the lower end of the process module. The adapter plate includes a first set of bores arranged around the inner cavity and a second set of bores arranged along the outer perimeter. First fasteners fasten the pump to the adapter plate through the first set of bores. Second fasteners fasten the adapter plate to the process module through the second set of bores.

In other features, the system further comprises a plurality of notches arranged along the outer perimeter of the adapter plate. The notches mate with corresponding aligning structures on the lower end of the process module.

In another feature, the system further comprises an annular liner lining the opening at the lower end of the process module and lining the inner cavity of the adapter plate.

In another feature, the adapter plate further comprises a notch on an inner surface of the adapter plate. The notch extends from an upper surface of the adapter plate to a location above a lower surface of the adapter plate. The notch extends radially outwardly from the inner surface by a first distance.

In another feature, the notch is in fluid communication with an exhaust channel located above the opening at the lower end of the process module.

In another feature, the adapter plate further comprises a groove in an upper surface of the adapter plate and adjacent to the inner cavity for an O-ring that forms a seal between the adapter plate and the process module.

In other features, the inner cavity is circular, and the outer perimeter is polygonal.

In other features, the inner cavity and the outer perimeter are circular.

In another feature, the first set of bores has a smaller diameter than the second set of bores.

In another feature, the second set of bores includes fewer bores than the first set of bores.

In another feature, bores in at least one of the first and second sets of bores are threaded.

In another feature, the first set of bores is arranged along a circle.

In other features, the first set of bores is arranged along a first circle having a first diameter. The second set of bores is arranged along a second circle having a second diameter that is greater than the first diameter. The first and second circles are concentric.

In other features, the outer perimeter is polygonal, and the plurality of notches is arranged along a single edge of the outer perimeter.

In other features, the outer perimeter is polygonal, and the plurality of notches is arranged along a plurality of edges of the outer perimeter.

In still other features, an adapter plate comprises an upper surface, a lower surface, and an inner cavity. The upper surface of the adapter plate is removably attachable to a process module of a substrate processing system. The lower surface of the adapter plate is opposite to the upper surface and is removably attachable to a pump of the substrate processing system. The inner cavity in the adapter plate extends from the upper surface to the lower surface. An outer side surface of the adapter plate extends between the upper and lower surfaces and defines an outer perimeter of the adapter plate. An inner side surface of the adapter plate extends in the inner cavity between the upper and lower surfaces. A first set of bores extend between the upper and lower surfaces. The first set of bores is arranged around the inner cavity. The lower surface of the adapter plate is removably attachable to the pump by first fasteners passing through the first set of bores. A second set of bores extends between the upper and lower surfaces. The second set of bores is arranged along the outer perimeter. The upper surface of the adapter plate is removably attachable to the process module by second fasteners passing through the second set of bores.

In other features, the adapter plate further comprises a plurality of notches arranged along the outer perimeter. The notches extend between the upper and lower surfaces.

In another feature, the adapter plate further comprises a notch in the inner side surface. The notch extends vertically from the upper surface up to a first distance above the lower surface. The notch extends radially outwardly from the inner side surface for a second distance.

In another feature, the adapter plate further comprises a groove in the upper surface and adjacent to the inner cavity for an O-ring that forms a seal between the adapter plate and the process module.

In other features, the inner cavity is circular, and the outer perimeter is polygonal.

In other features, the inner cavity and the outer perimeter are circular.

In another feature, the first set of bores has a smaller diameter than the second set of bores.

In another feature, the second set of bores includes fewer bores than the first set of bores.

In another feature, bores in at least one of the first and second sets of bores are threaded.

In another feature, the first set of bores is arranged along a circle.

In other features, the first set of bores is arranged along a first circle having a first diameter. The second set of bores is arranged along a second circle having a second diameter that is greater than the first diameter. The first and second circles are concentric.

In other features, the adapter plate further comprises a plurality of notches arranged along the outer perimeter. The outer perimeter is polygonal. The plurality of notches is arranged along a single edge of the outer perimeter.

In other features, the adapter plate further comprises a plurality of notches arranged along the outer perimeter. The outer perimeter is polygonal. The plurality of notches is arranged along a plurality of edges of the outer perimeter.

In other features, a system comprises the adapter plate, the first and second fasteners, the pump, and the process module. The pump is mounted to the lower surface of the adapter plate by the first fasteners. The upper surface of the adapter plate is mounted to a lower end of the process module by the second fasteners.

In other features, the lower end of the process module has a larger perimeter than the outer perimeter of the adapter plate and has an opening coincident with the inner cavity in the adapter plate. The system further comprises an annular liner lining the opening and the inner cavity.

In other features, the adapter plate includes a notch on the inner side surface. The notch extends from the upper surface to a location above the lower surface. The notch extends radially outwardly from the inner side surface by a first distance. The notch is in fluid communication with an exhaust channel located above an opening at the lower end of the process module.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The turbo pump is used to evacuate process gases from a process module (PM). The turbo pump spins at high speed (e.g., 28,000 RPM) and has high rotational inertia. The turbo pump may fail when debris from the process module is caught in rotors of the turbo pump. When the turbo pump fails, the high rotational inertia of the turbo pump may bend bolts attaching the turbo pump to the process module. As a result, the bolts are not easy remove. Depending on the severity of failure of the turbo pump, the bottom of the process module may also be damaged.

In substrate processing systems using pendulum valves, the bolts between the turbo pump and the pendulum valve may be bent when failure occurs. However, the turbo pump and the pendulum valve can usually still be removed using the bolts between the pendulum valve and the process module.

In other substrate processing systems using poppet valves, the turbo pump is directly attached to the bottom of the process module, and a poppet valve is nested therebetween. When the turbo pump in these substrate processing systems fails, it is difficult to remove the turbo pump from the process module.

To protect the process module and to improve the serviceability of the turbo pump, an adapter plate according to the present disclosure is arranged between the turbo pump and the bottom of the process module. The turbo pump is mounted on the adapter plate, and the adapter plate is mounted on the process module. When the turbo pump fails, while the bolts that attach the turbo pump to the adapter plate may bend, the bolts that attach the adapter plate to the bottom of the process module do not bend. Accordingly, the adapter plate protects the bottom of the process module from damage due to turbo pump failure. Further, the adapter plate is easy to remove from the process module. Accordingly, after a failure, the turbo pump can be serviced by first removing the adapter plate from the process module and then removing the turbo pump from the adapter plate. After servicing, the turbo pump can be coupled to the bottom of the process module using the same adapter plate or another adapter plate if damage occurs to the adapter plate.

In addition, the present disclosure provides an annular liner that lines the opening at the bottom of the process module through which the turbo pump evacuates process gases from the process module. When the turbo pump fails, chunks or pieces of metal debris from broken rotors can damage portions of chamber walls near the opening at the bottom of the process module. In the event of a failure of the turbo pump, the annular liner protects the chamber walls near the opening at the bottom of the process module by preventing the debris from impacting the chamber walls near the opening at the bottom of the process module. These and other features of the present disclosure are described below in detail.

Figure 1:
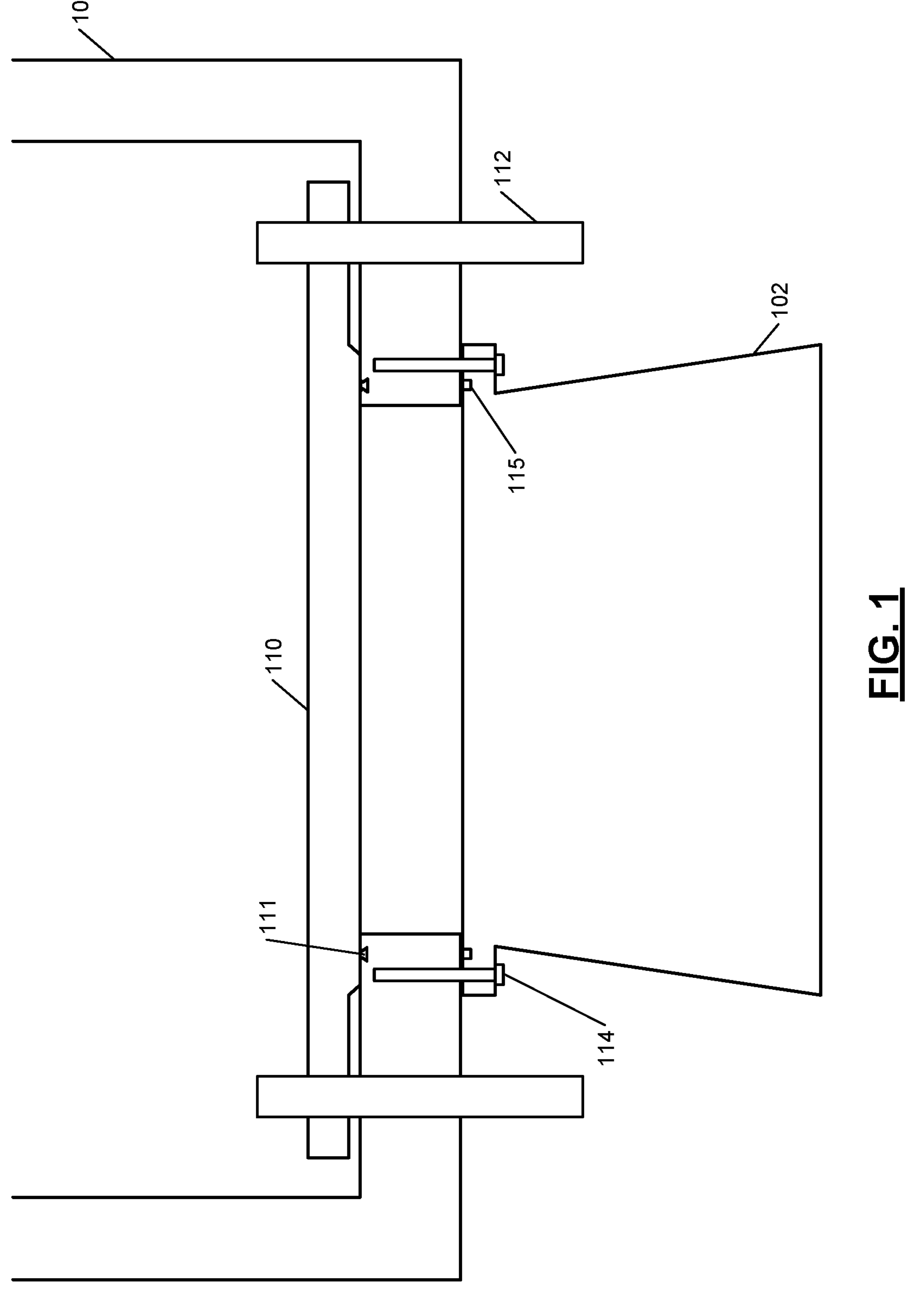
FIG. 1 is a cross-sectional view of a lower portion of a process module with an internal poppet valve and a turbo pump (internal components omitted) mounted directly to the process module.

FIG. 1 shows a turbo pump 102 connected directly to a process module 100. Internal components of the turbo pump 102 such as stator, rotors, etc. are omitted in all figures. A poppet valve 110 is nested between the process module 100 and the turbo pump 102. The poppet valve 110 includes a plate that is moved by actuators 112 to vary flow of gases between the process module 100 and the turbo pump 102. The poppet valve 110 is opened to allow the turbo pump 102 to control pressure and/or to evacuate process gases from the process module 100.

An O-ring is arranged in a groove 111 that is located in an inner upper portion of the bottom wall of the process module 100. The O-ring in the groove 111 surrounds the opening at the bottom of the process module 100. When the poppet valve 110 is closed, the plate of the poppet valve 110 presses firmly against the O-ring in the groove 111, which seals the process module 100.

In this design, the turbo pump 102 is bolted directly to the bottom of the process module 100 by bolts 114. An O-ring is arranged in a groove 115 provided in a flange of the turbo pump 102 to seal the top of the turbo pump 102 against the opening at the bottom of the process module 100. When the turbo pump 102 fails while spinning, the bolts 114 may bend due to the relatively high rotational inertia of the turbo pump 102. The bolts 114 are difficult to access and remove. Further, depending on the severity of failure of the turbo pump 102, the bending of the bolts 114 can also damage the bottom of the process module 100.

Figure 2:
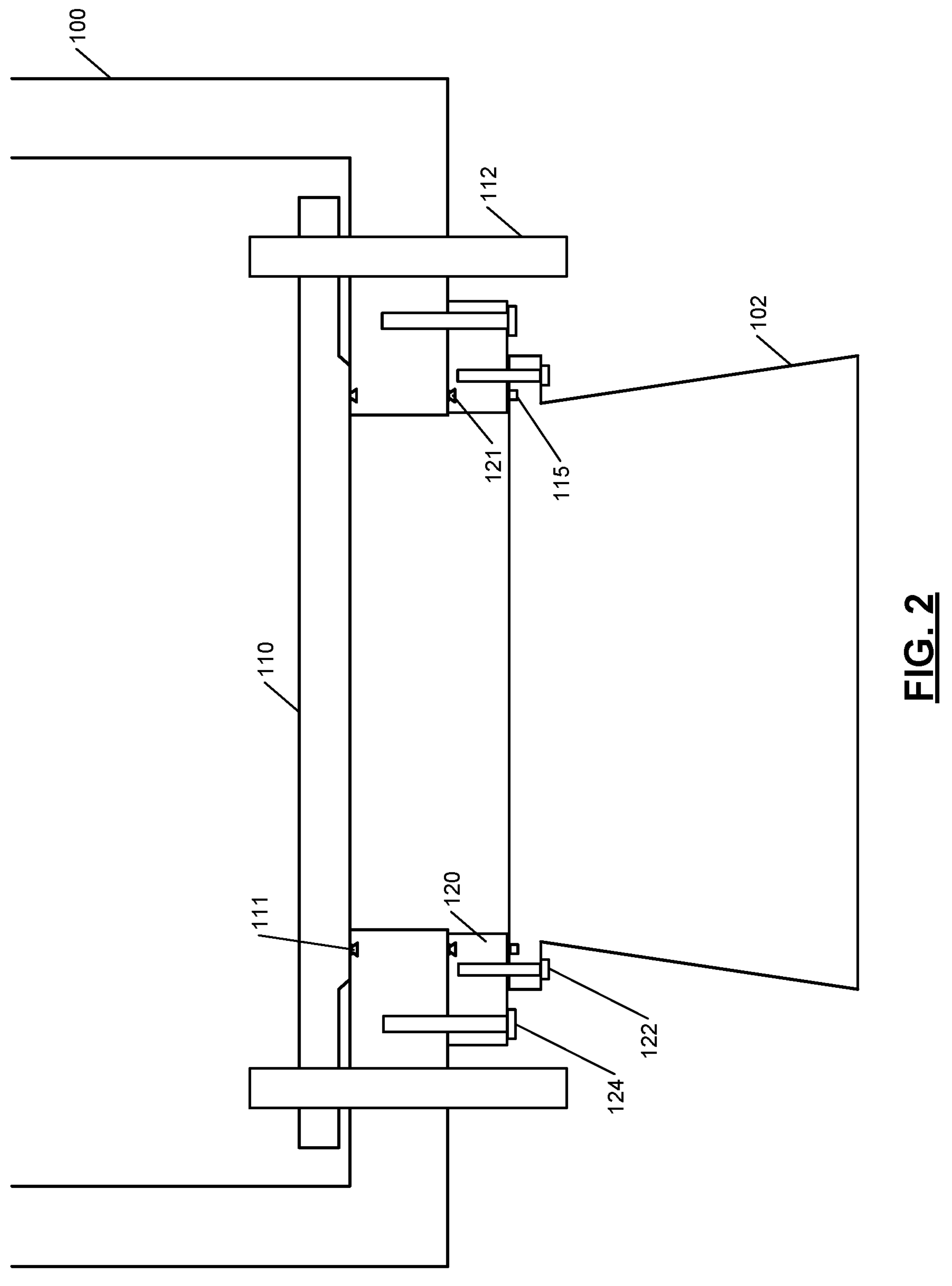
FIG. 2 is a cross-sectional view of a lower portion of a process module with an internal poppet valve and a turbo pump (internal components omitted) mounted to an adapter plate and the adapter plate mounted to the process module according to the present disclosure.

FIG. 2 shows the turbo pump 102 connected to the process module 100 by an adapter plate 120 according to the present disclosure. The poppet valve 110 is nested between the turbo pump 102 and the process module 100. When closed, the poppet valve 110 and the O-ring in the groove 111 seal the process module 100. The turbo pump 102 is mounted to a lower surface of the adapter plate 120 by bolts 122. The O-ring in the groove 115 seals the top of the turbo pump 102 against a lower surface of the adapter plate 120.

The adapter plate 120 (specifically, an upper surface of the adapter plate 120) is mounted directly to the bottom of the process module 100 by bolts 124. The bolts 124 can be larger in size (and therefore can be heavier and stronger to withstand shear force) than the bolts 122. The bolts 124 can be fewer in number than the bolts 122.

An O-ring is arranged in a groove 121 that is located on the upper surface of the adapter plate 120 that is mounted to the bottom wall of the process module 100. The groove 121 is adjacent to an inner diameter of (or inner cavity in) the adapter plate 120 (shown in FIG. 3). When the adapter plate is mounted to the bottom wall of the process module 100, the O-ring in the groove 121 surrounds the opening at the bottom of the process module 100 and provides a seal between the adapter plate 120 and the opening at the bottom of the process module 100.

In this design, when the turbo pump 102 fails, the bolts 122 may bend due to the relatively high rotational inertia of the turbo pump 102. However, the bolts 124 do not bend. Accordingly, when the turbo pump 102 fails, the adapter plate 120 can be removed from the process module 100 by removing the bolts 124. Thereafter, the turbo pump 102 can be removed from the adapter plate 120 by removing the bolts 122. The turbo pump 102 can be serviced. After servicing, the turbo pump 102 can be mounted to the same adapter plate 120 or another adapter plate 120 using new bolts 122. The adapter plate 120 with the turbo pump 102 can be mounted to the bottom of the process module 100 by the bolts 124.

Figure 3:
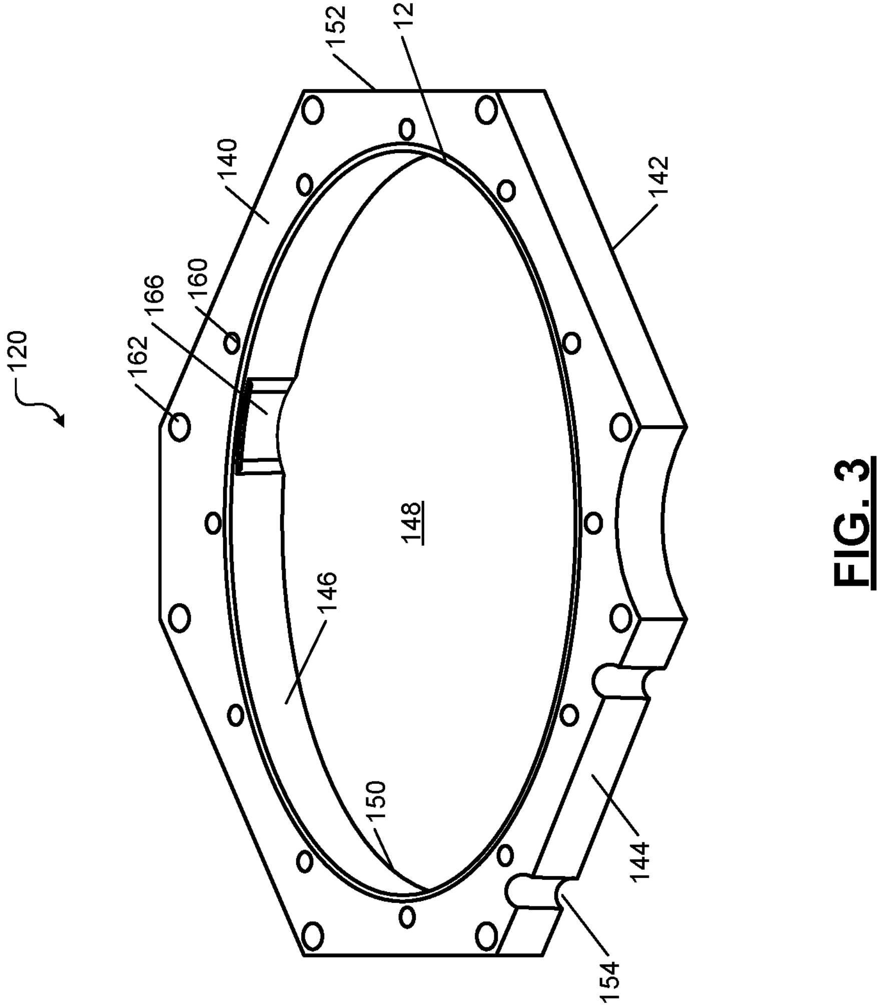
FIG. 3 is a perspective view of an example of the adapter plate according to the present disclosure.

FIG. 3 shows the adapter plate 120 in further detail. While a specific geometry of the adapter plate 120 is shown and described below, other geometries can be used. For example, the adapter plate 120 includes an outer perimeter 152 and an inner cavity 148 defining an inner diameter 150. The inner diameter 150 may be slightly greater than or may be substantially equal to the diameter of the opening at the bottom of the process module 100 (see FIG. 5). For example only, the outer perimeter 152 (i.e., outer shape) of the adapter plate 120 is shown as octagonal. However, the outer perimeter 152 of the adapter plate 120 can have different shapes for different process modules and may be dictated by the layout of other components located on the bottom of the process module 100. For example, in some applications, the outer perimeter 152 of the adapter plate 120 may be polygonal (e.g., pentagonal, hexagonal, heptagonal, triangular, rectangular, square, etc.). In some applications, the outer perimeter 152 of the adapter plate 120 may be oval or circular as well. In some applications, the outer perimeter 152 of the adapter plate 120 can have an irregular shape.

Figure 4:
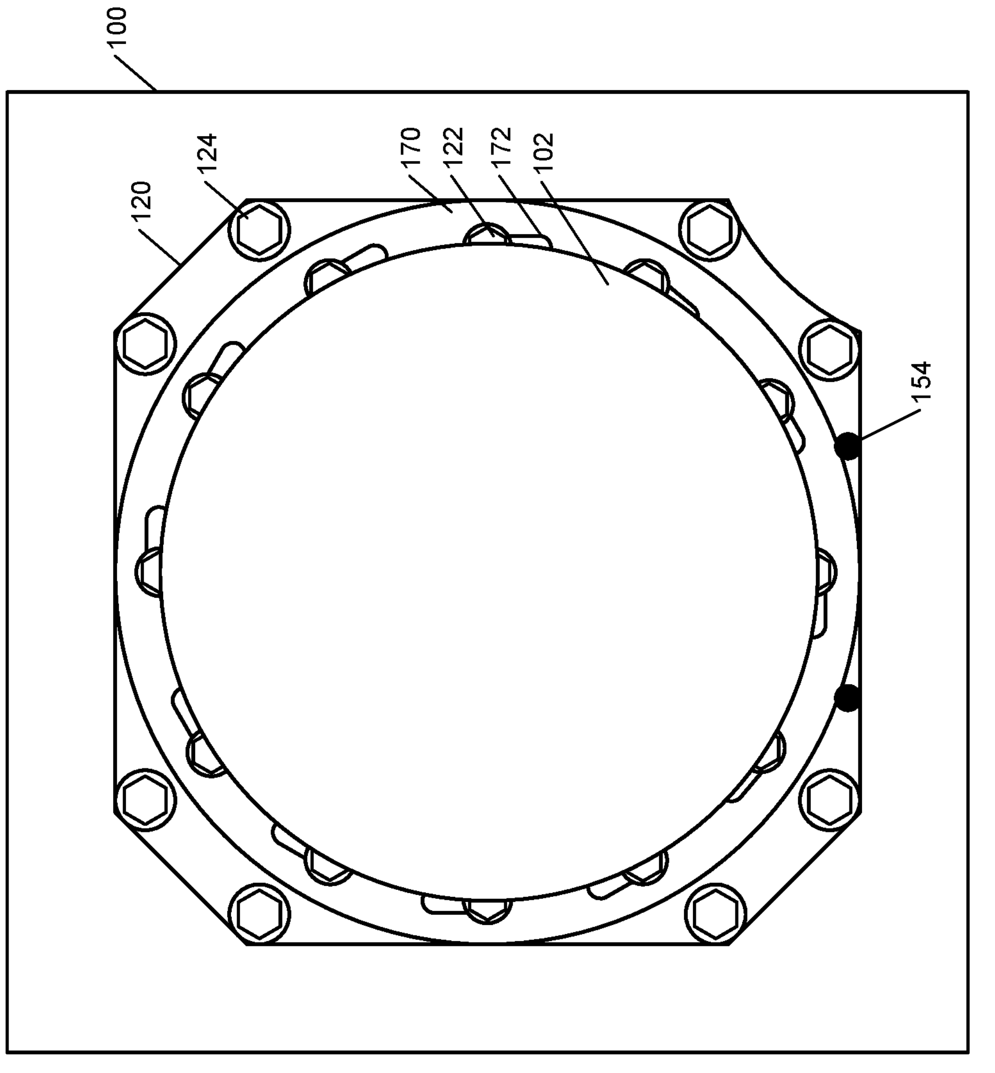
FIG. 4 is a bottom view of the turbo pump, the adapter plate, and the process module according to the present disclosure.

The outer perimeter 152 of the adapter plate 120 includes a plurality of notches 154 to allow alignment of the adapter plate 120 with corresponding components located on the bottom of the process module 100 (see FIG. 4). In some examples, the notches 154 are asymmetric and can be installed only in one orientation. As a result, the notches 154 help in ensuring that the adapter plate 120 is correctly installed with a particular orientation relative to the surrounding components.

For example only, the notches 154 are shown on one edge of the outer perimeter 152 of the adapter plate 120. In some applications, additional notches can be located along other edges of the outer perimeter 152 of the adapter plate 120. Further, the size and shape of the notches 154 can be different. For example, in some applications, the notches 154 need not extend all the way through the vertical thickness (i.e., height) of the adapter plate 120. Rather, the notches 154 can extend partially through the vertical thickness (i.e., height) of the adapter plate 120 from the turbo pump side and/or the process module side.

The adapter plate 120 includes a first set of threaded bores 160 arranged adjacent to the inner diameter 150 of the adapter plate 120. For example, the first set of threaded bores 160 are arranged adjacent to the groove 121. In some examples, the first set of threaded bores 160 are arranged in a first circle having a first diameter. The first set of threaded bores 160 receive the bolts 122 (see FIGS. 2 and 4) that fasten the turbo pump 102 to the adapter plate 120. In some examples, the number of the bores in the first set of threaded bores 160 is equal to the number of mounting bores on the turbo pump 102.

While not shown, a second (spare) set of threaded bores that is similar to the first set of threaded bores 160, and that is concentric and rotationally offset relative to the first set of threaded bores 160 can be provided. The second (spare) set of threaded bores can serve as a replacement for the first set of threaded bores 160 if one or more bores in the first set of threaded bores 160 is deformed or damaged when the turbo pump 102 fails. In some embodiments, the first set of threaded bores 160 and the second (spare) set of threaded bores can be arranged in different configurations to accommodate different mounting geometries of different turbo pumps.

The adapter plate 120 includes a second set of bores 162 arranged adjacent to the outer perimeter 152 of the adapter plate 120. In some examples, the second set of bores 162 are arranged in a second circle having a second diameter that is greater than the first diameter. For example, the first and second circles can be concentric. The bolts 124 pass through the second set of bores 162 (see FIGS. 2 and 4) and fasten the adapter plate 120 to threaded bores in the bottom of the process module 100.

The second set of bores 162 are located farther away from the center of the adapter plate 120 than the first set of threaded bores 160. For example only, the second set of bores 162 are shown to be located at intersections of the edges of the outer perimeter 152. However, the second set of bores 162 can be located anywhere along the outer perimeter 152. Further, while the second set of bores 162 are shown as distributed symmetrically along the edges of the outer perimeter 152, the arrangement of the second set of bores 162 can be asymmetric along the edges of the outer perimeter 152. In some embodiments, the second set of bores 162 can also be arranged in different configurations to accommodate different mounting geometries of different process modules.

Accordingly, in general, the adapter plate 120 includes an upper surface 140, a lower surface 142, outer side surfaces 144 extending between the upper and lower surfaces 140, 142 and defining the outer perimeter 152, and inner surfaces 146 extending between the upper and lower surfaces 140, 142 and defining an inner cavity 148 of the adapter plate 120. The first set of threaded bores 160 extend between the upper and lower surfaces 140, 142 and are arranged along a circle around the inner cavity 148. The second set of bores 162 extend between the upper and lower surfaces 140, 142 and are arranged along the outer perimeter 152. The notches 154 are arranged along the outer perimeter 152. The adapter plate 120 can be made of a metal or an alloy having relatively high mechanical strength.

When used in a conductor etch process module, for inert gas evacuation, the adapter plate 120 (shown in FIG. 6 as adapter plate 123) includes the following two features that are different than the adapter plate 120 that is described above and that is suitable for use in a dielectric etch process module. First, the adapter plate 123 has a larger inner diameter than the inner diameter 150 of the adapter plate 120 used in the dielectric etch process module. Second, the adapter plate 123 includes an additional partial notch 166. As explained with reference to FIG. 6 below, these features (i.e., the larger inner diameter and the additional partial notch 166), along with a liner that is shorter than a liner used in the dielectric etch process module, help with inert gas evacuation in conductor etch process modules.

FIG. 4 shows a bottom view of the turbo pump 102, the adapter plate 120, and the process module 100. An upper end of the turbo pump 102 includes a radial flange 170. The radial flange 170 includes bores 172 that are elongated in a circumferential direction to vary rotational alignment. The bores 172 align with the first set of threaded bores 160 in the adapter plate 120. The bolts 122 pass through the radial flange 170, the bores 172, and the first set of threaded bores 160 and fasten the turbo pump 102 to the adapter plate 120. The bolts 124 pass through the second set of bores 162 and fasten the adapter plate 120 to the bottom of the process module 100. As seen, while the bolts 122 can deform when the turbo pump 102 fails and are difficult to access and remove, the bolts 124 do not deform when the turbo pump 102 fails and are easier to access and remove, which makes it easy to service the turbo pump 102.

Figure 5:
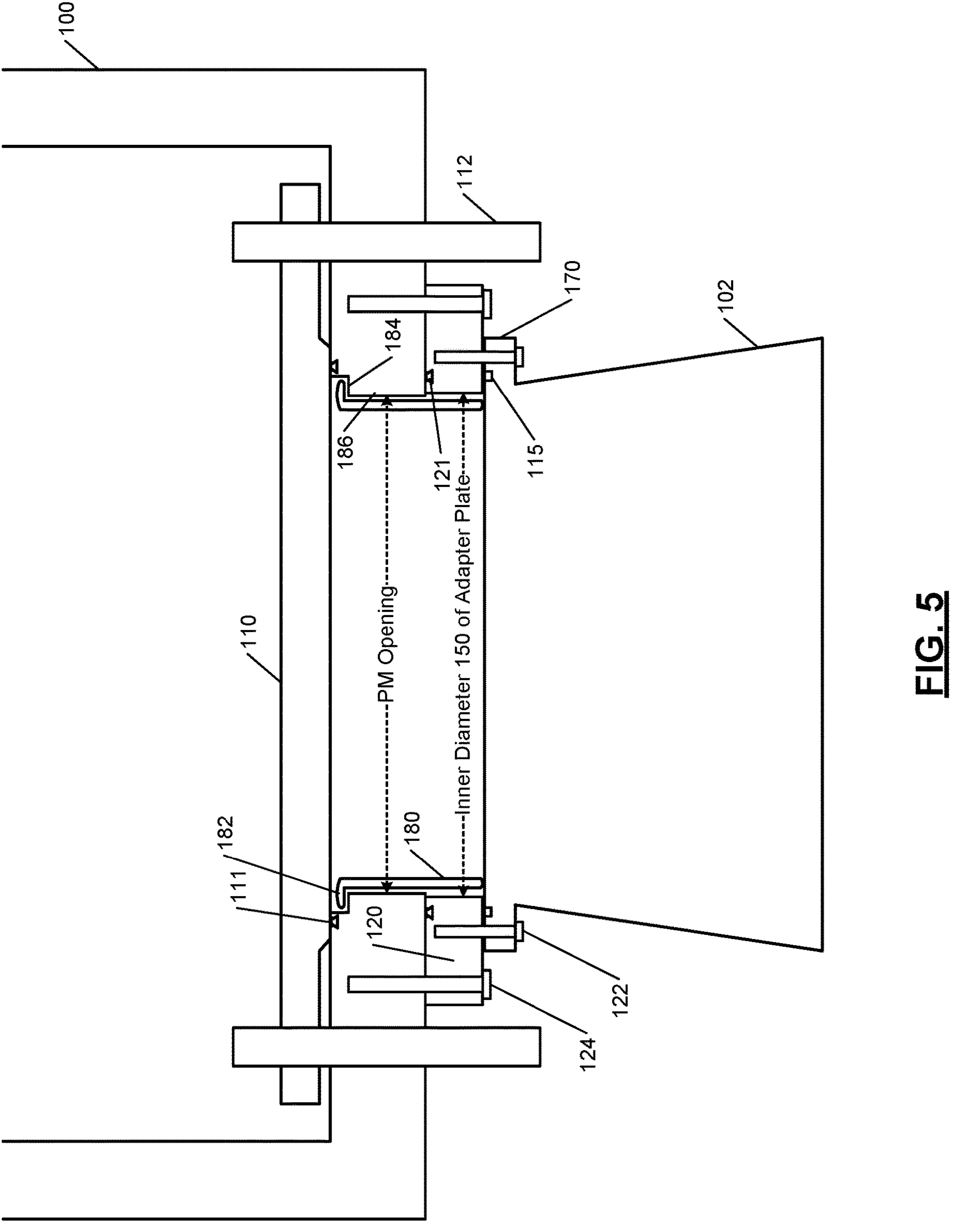
FIG. 5 is a cross-sectional view of a lower portion of the process module including the poppet valve and a liner, and with the turbo pump (internal components omitted) attached to the bottom of the process module using the adapter plate of FIG. 3 according to the present disclosure.

FIG. 5 shows a cross-sectional view of a lower portion of the process module 100. The turbo pump 102 is attached by the adapter plate 120 to the bottom of the process module 100. The poppet valve 110 is shown in the closed position. A liner 180 lines the bottom opening of the process module 100. The liner 180 is annular and includes a flange 182. The flange 182 extends radially outwardly and rests on an annular recess 184 formed on an upper portion of the opening of the process module 100. The liner 180 extends downwardly from the flange 182 through the opening past the bottom of the process module 100 to the top of the turbo pump 102. The liner 180 extends to a point where the turbo pump 102 attaches to the adapter plate 120. When the turbo pump 102 fails, the liner 180 prevents any debris from the turbo pump 102 from impacting chamber walls 186 near the opening at the bottom of the process module 100. Thus, the liner 180 protects the chamber walls 186 near the opening at the bottom of the process module 100 from flying debris when the turbo pump 102 fails.

The outer diameter of the liner 180 (excluding the flange 182) is slightly less than or substantially equal to the diameter of the opening at the bottom of the process module 100. The outer diameter of the liner 180 (excluding the flange 182) is slightly less than or substantially equal to the inner diameter 150 of the adapter plate 120. The inner diameter of the liner 180 is less than the diameter of the opening at the bottom of the process module 100. The inner diameter of the liner 180 is less than the inner diameter 150 of the adapter plate 120. The outer diameter of the flange 182 is greater than the diameter of the opening at the bottom of the process module 100. The outer diameter of the flange 182 is greater than the inner diameter 150 of the adapter plate 120. The liner 180 is removable. The inner diameter 150 of the adapter plate 120 and the length (or height) of the liner 180 shown in FIG. 5 are suitable for use in a variety of etch process modules. Furthermore, the inner diameter 150 of the adapter plate 120 can be suitable for use with different mounting geometries of different turbo pumps; and likewise, the outer perimeter 152 of the adapter plate 120 can be suitable for use with different mounting geometries of different process modules.

Figure 6:
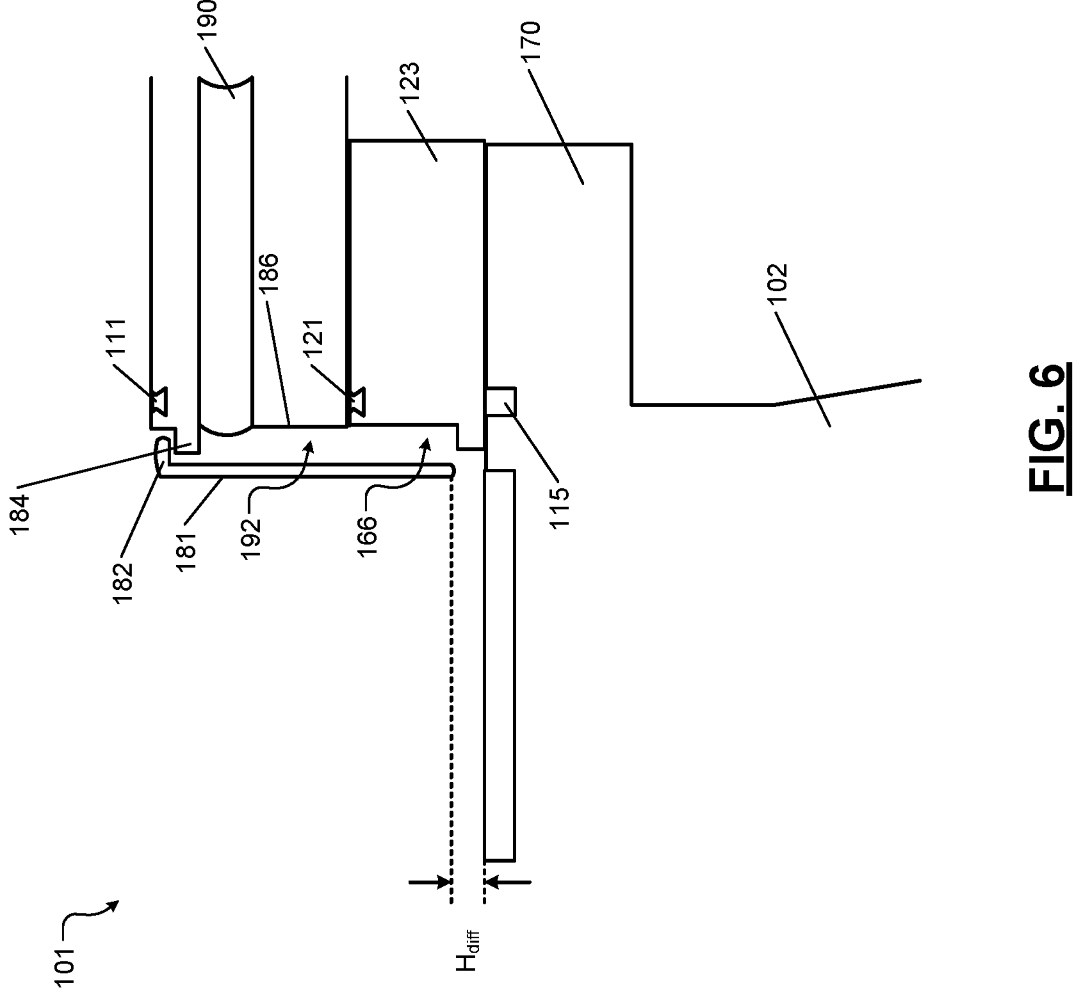
FIG. 6 is a cross-sectional view of a portion of the process module showing a partial notch on the adapter plate in communication with an exhaust channel of the process module according to the present disclosure.

FIG. 6 shows a cross-sectional view of a portion of a process module 101 with an example of the adapter plate 123 that is suitable for use in conductor etch process modules. The adapter plate 123 includes the partial notch 166. In this example, the process module 101 performs a conductor etch process and includes a liner 181 and an exhaust channel 190 of the process module 101. The exhaust channel 190 is used for inert gas evacuation. The inner diameter of the adapter plate 123 is greater than the inner diameter 150 of the adapter plate 120 shown in FIG. 5. Further, the liner 181 is shorter (in height or length) than the liner 180 shown in FIG. 5 (the difference is shown by dotted lines as $H_{diff}$).

The partial notch 166 is so called since the bottom portion of the adapter plate 123 (on the side of the turbo pump 102) is not notched through. That is, the partial notch 166 does not extend through the lower surface 142 of the adapter plate 123. Rather, the partial notch 166 extends vertically downwards along the inner surface 146 from the upper surface 140 to a short distance above the lower surface 142 and extends radially outwardly from the inner surface 146 for a relatively short distance. Accordingly, the height of the partial notch 166 from the upper surface 140 to a short distance above the lower surface 142 is less than the vertical thickness or height of the adapter plate 123. The depth or width of the partial notch 166 (i.e., the distance for which the partial notch extends radially outwardly from the inner surface 146) is much less than the height of the partial notch 166. The partial notch 166 aligns with a notch 192 in the chamber wall 186 of the process module 101.

The larger inner diameter of the adapter plate 123 and the shorter liner 181 (than the respective parameters shown in FIG. 5), along with the additional partial notch 166 in the adapter plate 123 allow for inert gas evacuation through the exhaust channel 190 during the conductor etch process performed by the process module 101.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including “connected,” “engaged,” “coupled,” “adjacent,” “next to,” “on top of,” “above,” “below,” and “disposed.” Unless explicitly described as being “direct,” when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean “at least one of A, at least one of B, and at least one of C.”

What is claimed is:

1. A system comprising:

a process module configured to process a semiconductor substrate, the process module having an opening at a lower end of the process module and including a poppet valve arranged in the process module directly above the opening;

a pump configured to operate in conjunction with the poppet valve to evacuate gases from the process module, wherein the poppet valve is positioned between the pump and the process module;

an adapter plate arranged above the pump and below the opening at the lower end of the process module, the adapter plate including an inner cavity coincident with the opening and an outer perimeter smaller than the lower end of the process module, the adapter plate including:

a first set of bores arranged around the inner cavity; and a second set of bores arranged along the outer perimeter;

first fasteners fastening the pump to the adapter plate through the first set of bores; and second fasteners fastening the adapter plate to the process module through the second set of bores.

2. The system of claim 1 further comprising a plurality of notches arranged along the outer perimeter of the adapter plate, the notches mating with corresponding aligning structures on the lower end of the process module.

3. The system of claim 2 wherein:

the outer perimeter is polygonal; and the plurality of notches is arranged along a single edge of the outer perimeter.

4. The system of claim 2 wherein:

the outer perimeter is polygonal; and the plurality of notches is arranged along a plurality of edges of the outer perimeter.

5. The system of claim 1 further comprising an annular liner lining the opening at the lower end of the process module and lining the inner cavity of the adapter plate.

6. The system of claim 1 wherein the adapter plate further comprises a notch on an inner surface of the adapter plate, the notch extending from an upper surface of the adapter plate to a location above a lower surface of the adapter plate and extending radially outwardly from the inner surface by a first distance.

7. The system of claim 6 wherein the notch is in fluid communication with an exhaust channel located above the opening at the lower end of the process module.

8. The system of claim 1 wherein the adapter plate further comprises a groove in an upper surface of the adapter plate and adjacent to the inner cavity for an O-ring that forms a seal between the adapter plate and the process module.

9. The system of claim 1 wherein:

the inner cavity is circular; and the outer perimeter is polygonal.

10. The system of claim 1 wherein the inner cavity and the outer perimeter are circular.

11. The system of claim 1 wherein the first set of bores has a smaller diameter than the second set of bores.

12. The system of claim 1 wherein the second set of bores includes fewer bores than the first set of bores.

13. The system of claim 1 wherein bores in at least one of the first and second sets of bores are threaded.

14. The system of claim 1 wherein the first set of bores is arranged along a circle.

15. The system of claim 1 wherein:

the first set of bores is arranged along a first circle having a first diameter;

the second set of bores is arranged along a second circle having a second diameter that is greater than the first diameter; and the first and second circles are concentric.

* * * * *